(12) United States Patent
Grimm et al.

(10) Patent No.: US 8,717,086 B2
(45) Date of Patent: *May 6, 2014

(54) ADAPTIVE CASCODE CIRCUIT USING MOS TRANSISTORS

(71) Applicant: Silergy Semiconductor Technology (Hangzhou) LTD, Hangzhou (CN)

(72) Inventors: Michael Grimm, Los Altos Hills, CA (US); Jun Chen, Hangzhou (CN)

(73) Assignee: Silergy Semiconductor Technology (Hangzhou) Ltd, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/018,570

(22) Filed: Sep. 5, 2013

(65) Prior Publication Data
US 2014/0002051 A1    Jan. 2, 2014

Related U.S. Application Data

(63) Continuation of application No. 13/711,447, filed on Dec. 11, 2012, now Pat. No. 8,570,093.

(30) Foreign Application Priority Data

Dec. 15, 2011    (CN) .......................... 2011 1 0418093

(51) Int. Cl.
H03K 17/687    (2006.01)
H03K 17/10    (2006.01)

(52) U.S. Cl.
CPC ................................. *H03K 17/102* (2013.01)
USPC .......................................... 327/436; 327/309

(58) Field of Classification Search
CPC ........ H03K 17/10; H03K 17/102; H03K 3/42

USPC ......... 327/306, 309, 325, 326, 333, 419, 427, 327/434, 436; 330/253

See application file for complete search history.

(56) References Cited

U.S. PATENT DOCUMENTS

| 3,603,892 A | 9/1971 | Paine et al. |
| 3,622,899 A | 11/1971 | Eisenberg |
| 3,900,800 A | 8/1975 | Maltz |
| 3,940,683 A | 2/1976 | Blauschild |
| 4,070,589 A | 1/1978 | Martinkovic |
| 4,317,055 A * | 2/1982 | Yoshida et al. ................ 327/541 |
| 4,367,421 A | 1/1983 | Baker |

(Continued)

FOREIGN PATENT DOCUMENTS

| CN | 201966801 U | 9/2011 |
| CN | 202034896 U | 11/2011 |

*Primary Examiner* — William Hernandez
(74) *Attorney, Agent, or Firm* — Michael C. Stephens, Jr.

(57) ABSTRACT

The present invention relates to a cascode circuit using MOS transistors. In one embodiment, an adaptive cascode circuit can include: (i) a main MOS transistor; (ii) n adaptive MOS transistors coupled in series to the drain of the main MOS transistor, where n can be an integer greater than one; (iii) a shutdown clamping circuit connected to the gates of the n adaptive MOS transistors, where the shutdown clamping circuit may have (n+1) shutdown clamping voltages no larger than rated gate-drain voltages of the main MOS transistor and n adaptive MOS transistors; and (iv) n conduction clamping circuits coupled correspondingly to the gates of the adaptive MOS transistors, where the n conduction clamping circuits may have n conduction clamping voltages no larger than the conduction threshold voltages of the adaptive MOS transistors.

16 Claims, 12 Drawing Sheets

(56) References Cited

U.S. PATENT DOCUMENTS

| | | |
|---|---|---|
| 4,459,498 A | 7/1984 | Stengl et al. |
| 4,484,151 A | 11/1984 | Nijman et al. |
| 4,692,643 A | 9/1987 | Tokunaga et al. |
| 4,751,408 A | 6/1988 | Rambert |
| 4,900,955 A | 2/1990 | Kurpan |
| 6,617,906 B1 | 9/2003 | Hastings |
| 7,429,873 B2 * | 9/2008 | Peschke .................. 326/81 |
| 8,022,745 B1 | 9/2011 | Dening et al. |
| 2006/0231868 A1 * | 10/2006 | Yamada et al. ............. 257/239 |
| 2011/0228564 A1 | 9/2011 | Uruno et al. |
| 2011/0291738 A1 * | 12/2011 | Biela et al. .................. 327/430 |
| 2013/0258721 A1 * | 10/2013 | Boulharts et al. ......... 363/21.04 |

* cited by examiner

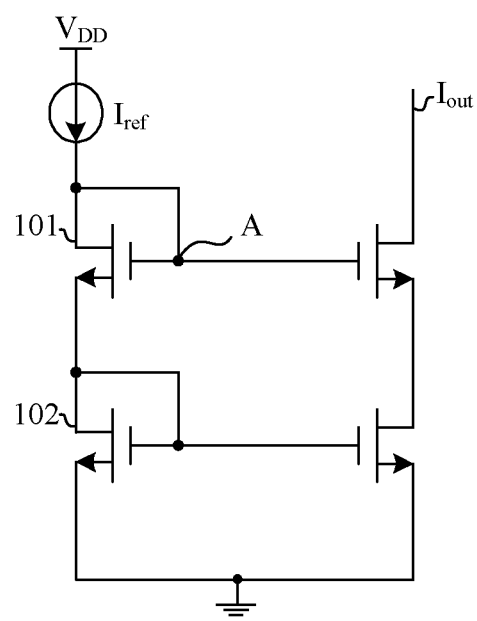
FIG. 1 (conventional)

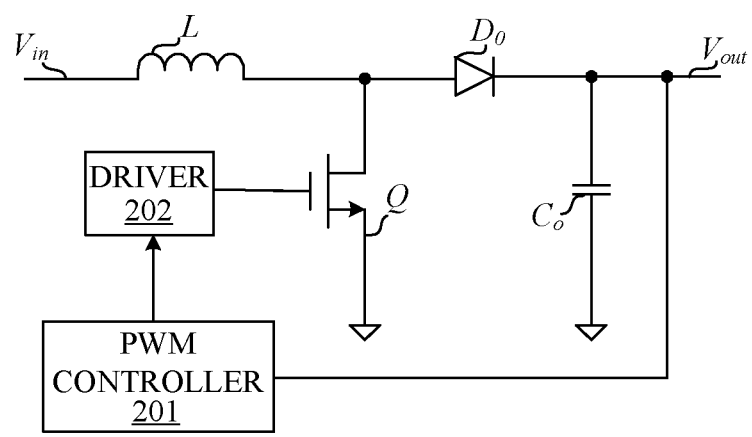
FIG. 2 (conventional)

ADAPTIVE CASCODE CIRCUIT USING MOS TRANSISTORS

RELATED APPLICATIONS

This application is a continuation of the following application, U.S. patent application Ser. No. 13/711,447, entitled "ADAPTIVE CASCODE CIRCUIT USING MOS TRANSISTORS," filed on Dec. 11, 2012, which is now issued as U.S. Pat. No. 8,570,093, and which is hereby incorporated by reference as if it is set forth in full in this specification, and which also claims the benefit of Chinese Patent Application No. 201110418093.6, filed on Dec. 15, 2011, which is incorporated herein by reference in its entirety.

FIELD OF THE INVENTION

The present invention relates to the field of analog circuits, and more specifically to an adaptive cascode circuit using MOS transistors.

BACKGROUND

In conventional approaches, cascode technology using MOS transistors can be used to improve the maximum output impedance of an equivalent MOS transistor while the maximum withstand voltage thereof is not increased. A schematic diagram of a conventional cascode current mirror using MOS transistors is shown in FIG. 1. In this example, a voltage at node A can be the sum of the gate-source voltages of MOS transistors 101 and 102. Also, the equivalent output impedance can be increased by applying the cascode MOS transistors, and the output current $I_{out}$ may not be affected by the output voltage. However, the highest withstand voltage may not be increased with this circuit structure. Therefore, this example may be limited to relatively low voltage applications rather than high voltage applications.

In FIG. 2, a conventional high voltage switching regulator example is shown, and may include driver 202, pulse width modulation (PWM) controller 201, inductor L, switch Q, output diode $D_0$, and output capacitor $C_0$. Here, switch Q may stand with a high voltage, so it may be convenient to select a MOS transistor with a high withstand voltage for switch Q. However, the associated costs may be relatively high. Also, in many applications, the maximum withstand voltages of MOS transistors may be limited by the processes utilized, and may fail to satisfy the needs of a particular application.

SUMMARY

In one embodiment, an adaptive cascode circuit can include: (i) a main MOS transistor, wherein the source of the main MOS transistor is configured as a first terminal of the adaptive cascode circuit, and the gate of the main MOS transistor is configured as a control terminal of the adaptive cascode circuit; (ii) n adaptive MOS transistors coupled in series to the drain of the main MOS transistor, the drain of a first adaptive MOS transistor being configured as a second terminal of the adaptive cascode circuit, where n can be an integer greater than one; (iii) a shutdown clamping circuit coupled to the gates of the n adaptive MOS transistors, where the shutdown clamping circuit may have (n+1) shutdown clamping voltages no larger than rated gate-drain voltages of the main MOS transistor and n adaptive MOS transistors; and (iv) n conduction clamping circuits coupled correspondingly to the gates of the adaptive MOS transistors, where the n conduction clamping circuits may have n conduction clamping voltages no larger than the conduction threshold voltages of the adaptive MOS transistors.

When the main MOS transistor and the adaptive MOS transistors are both shutdown, and the drain-gate voltages of the main MOS transistor and the adaptive MOS transistors may be larger than the shutdown clamping voltages, the shutdown clamping circuit can be configured to clamp the drain-gate voltages of the main MOS transistor and the adaptive MOS transistors to the shutdown clamping voltages correspondingly. Thus, the drain-gate voltages of the main MOS transistor and the adaptive MOS transistors can be assured to be no larger than the rated drain-gate voltages of the main MOS transistor and n adaptive MOS transistors. When the adaptive MOS transistors and the main MOS transistor are both conducting, the conduction clamping circuit can be configured to clamp the gate voltages of n adaptive MOS transistors to n conduction clamping voltages.

Embodiments of the present invention can advantageously provide several advantages over conventional approaches. For example, a cascode circuit using MOS transistors can achieve an equivalent MOS transistor with a relatively higher withstand voltage. The withstand voltage can be the sum of maximum withstand voltages of all series coupled MOS transistors, so the maximum withstand voltage of the equivalent MOS transistor may not be limited by semiconductor processes. Also, all the MOS transistors can be controlled in sequence by only one control signal. Other advantages of the present invention may become readily apparent from the detailed description of preferred embodiments below.

BRIEF DESCRIPTION OF THE DRAWINGS

FIG. 1 is a schematic diagram of a conventional cascode current mirror using MOS transistors.

FIG. 2 is a schematic diagram of a conventional high voltage switching regulator.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 3:
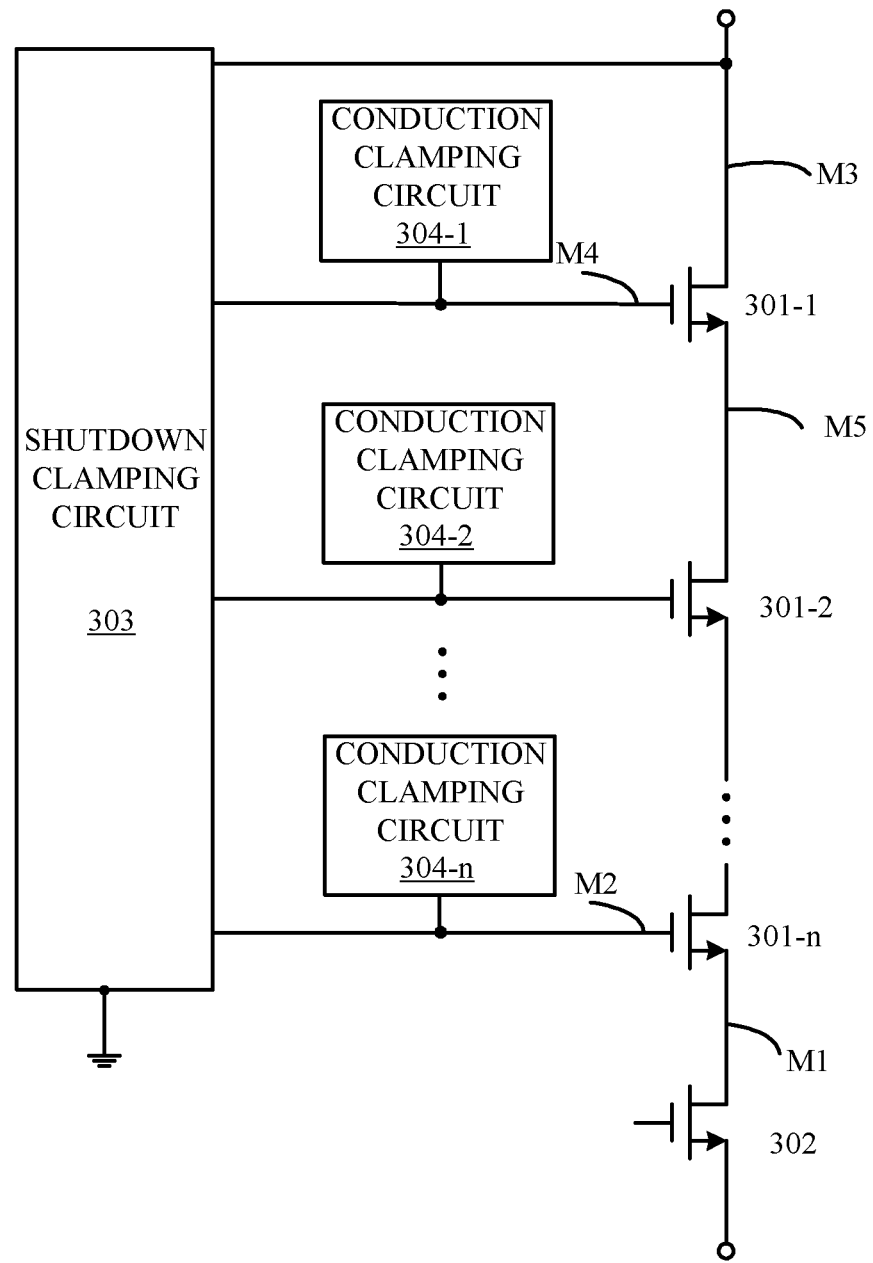
FIG. 3 is a schematic diagram of a first example adaptive cascode circuit using MOS transistors in accordance with embodiments of the present invention.

Referring to FIG. 3, shown is a schematic diagram of a first example adaptive cascode circuit using MOS transistors in accordance with embodiments of the present invention. The cascode circuit can include n series-connected adaptive MOS transistors 301-1, 301-2, . . . 301-n, where the drain of MOS transistor 301-1 can work as the second terminal of the adaptive cascode circuit, and n can denote an integer greater than 1. The cascode circuit can also include main MOS transistor 302 connected with adaptive MOS transistor 301-n, where the source of main MOS transistor 302 can work as the first terminal of the adaptive cascode circuit, and the gate of main MOS transistor 302 can work as the control terminal of the cascode circuit.

The cascode circuit can also include shutdown clamping circuit 303 that may be connected to the gates of adaptive MOS transistors 301-1, 301-2, . . . 301-n, where shutdown clamping circuit 303 can have (n+1) shutdown clamping voltages no larger than the rated drain-gate voltages of the corresponding n adaptive MOS transistors 301-1, 301-2, . . . 301-n and main MOS transistor 302. The cascode circuit can also include n conduction clamping circuits 304-1, 304-2, . . . 304-n that can be respectively connected to the gates of adaptive MOS transistors 301-1, 301-2, . . . 301-n, where n conduction clamping circuits 304-1, 304-2, . . . 304-n can have n conduction clamping voltages no less than the conduction threshold voltages of the corresponding adaptive MOS transistors 301-1, 301-2, . . . 301-n.

One example operation process of the cascode circuit using MOS transistors can be described as described below. The cascode circuit can receive a control signal at its control terminal to control the switching of main MOS transistor 302. When main MOS transistor 302 is conducting, the voltage at node M1 can be pulled down, and the voltage difference between the voltages at node M1 and node M2 may be increased to turn on adaptive MOS transistor 301-n, and then later the remaining adaptive MOS transistors can be turned on in sequence. After all the MOS transistors are turned on, the voltage at node M3 may also be pulled down.

However, because of the existence of Miller capacitance $C_{dg301-1}$ between the drain and the gate of adaptive MOS transistor 301-1, the voltage at node M4 may also be reduced to turn off adaptive MOS transistor 301-1. Also, the voltage at node M5 may be pulled down, and in the same way, the remaining adaptive MOS transistors may be turned off one by one before main MOS transistor 302 being turned off. To avoid that, conduction clamping circuits 304-1, 304-2 . . . 304-n can be configured to clamp the gate voltages of the corresponding adaptive MOS transistors to the conduction clamping voltages after all the MOS transistors are turned on. In this way, the gate voltages of the adaptive MOS transistors can be maintained to be no less than their threshold voltages above the corresponding source voltages.

Along the lines of the above description, when main MOS transistor 302 is turned off, the voltage at node M3 may be pulled up, and the voltage at node M4 can also be increased. However, since the equivalent capacitance between node M4 and ground may be relatively large, and Miller capacitance $C_{dg301-1}$ of adaptive MOS transistor 301-1 is relatively small, the voltage at node M4 may rise slower than the voltage at node M3. Thus, the voltage difference between the voltages at nodes M3 and M4 may be increased, which can lead to the drain-gate voltage of adaptive MOS transistor 301-1 becoming too large. The remaining adaptive MOS transistors may also face a similar problem. To avoid such problems, shutdown clamping circuit 303 can be utilized to clamp the drain-gate voltages of all MOS transistors to assure the drain-gate voltages of adaptive MOS transistors may be no larger than their rated drain-gate voltages.

By applying this example cascode circuit using MOS transistors as shown in FIG. 3, main MOS transistor 302 and adaptive MOS transistors 301-1, 301-2, . . . 301-n can be controlled in sequence substantially by only one control signal. All of the MOS transistors can be used to form an equivalent MOS transistor, and the equivalent MOS transistor can be maintained to operate safely by using shutdown clamping circuit 303 and conduction clamping circuits 304-1, 304-2, . . . 304-n. The maximum withstand voltage of the equivalent MOS transistor can be the sum of maximum withstand voltages of all the series-connected MOS transistors.

The cascode circuit in this example can also include n gate-source clamping circuits respectively coupled between the gates and sources of the corresponding adaptive MOS transistors 301-1, 301-2, . . . 301-n. The n gate-source clamping circuits can have n gate-source clamping voltages no larger than the rated gate-source voltages of the corresponding adaptive MOS transistors. When all the MOS transistors are turned on, the gate-source clamping circuit can be configured to maintain the voltages between the gates and sources of adaptive MOS transistors 301-1, 301-2 . . . 301-n to be no larger than their rated gate-source voltages. Here, the n gate-source clamping circuits are not shown in the particular diagram of FIG. 3.

It should be mentioned that the MOS transistors used in this example can be lateral double-diffused MOSFET (LDMOS) transistors, or any other appropriate type of MOS transistors. Also, as shown in FIG. 3, while N-type MOS transistors may be taken as examples to explain the arrangement and principle of the cascode circuit, people skilled in the art will recognize that P-type MOS transistors can also be utilized in a similar cascode circuit. Therefore, which MOS transistors should be used can be determined according to the particular application.

Figure 4:
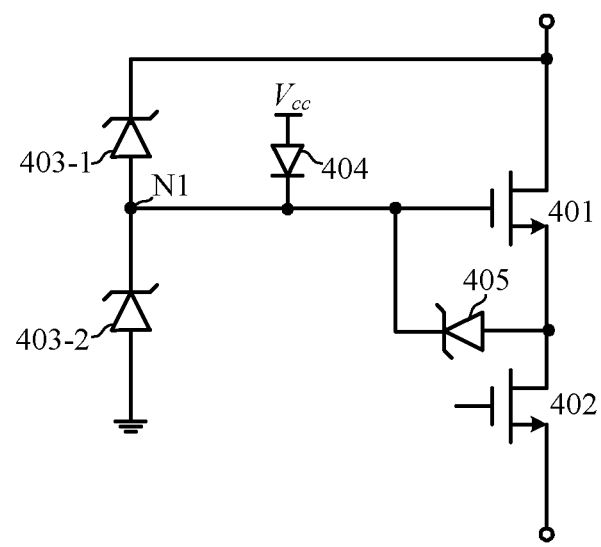
FIG. 4 is a schematic diagram of a second example adaptive cascode circuit using MOS transistors in accordance with embodiments of the present invention.

Referring to FIG. 4, shown is a schematic diagram of a second example adaptive cascode circuit using MOS transistors in accordance with embodiments of the present invention. In this example, N-type MOS transistors can be taken as examples to explain operating principles of the cascode circuit, conduction clamping circuit, and gate-source clamping circuit.

In this example, the cascode circuit can include adaptive MOS transistor 401, where the drain of MOS transistor 401 can be the second terminal of the cascode circuit. In addition, the cascode circuit can include main MOS transistor 402 connected with adaptive MOS transistor 401 in series, where the source of main MOS transistor 402 can be the first terminal of the cascode circuit, and the gate of main MOS transistor 402 can be the control terminal of the cascode circuit to receive a control signal to control the switching of main MOS transistor 402 and adaptive MOS transistor 401.

Also, the cascode circuit example of FIG. 4 can include a shutdown clamping circuit formed by series-connected zener diodes 403-1 and 403-2, where the cathode of zener diode 403-1 can operate as the first terminal of the shutdown clamping circuit and can be connected to the second terminal of the cascode circuit. The anode of zener diode 403-2 can be configured as the second terminal of the shutdown clamping circuit and can be connected to ground. The common node N1 of zener diodes 403-1 and 403-2 can be connected to the gate of adaptive MOS transistor 401. For example, the breakdown voltage of zener diode 403-1 can be no larger than the rated drain-gate voltage of adaptive MOS transistor 401, and the breakdown voltage of zener diode 403-2 can be no larger than the rated drain-gate voltage of main MOS transistor 402.

In addition, the cascode circuit example of FIG. 4 can include a conduction clamping circuit formed by diode 404, where the cathode of diode 404 can be connected to the gate of adaptive MOS transistor 401, and the anode of diode 404 can be connected to a constant voltage source. For example, the conduction clamping circuit can have a conduction clamping voltage of no less than the conduction threshold voltage of adaptive MOS transistor 401, and can be used to clamp the gate voltage of adaptive MOS transistor 401. In this example, the voltage source connected at the anode of diode 404 can be about the rated gate-source voltage $V_{cc}$ of main MOS transistor 402.

Also, the cascode circuit example of FIG. 4 can include a gate-source clamping circuit formed by zener diode 405, where the anode of zener diode 405 can be connected to the source of adaptive MOS transistor 401, and the cathode of zener diode 405 can be connected to the gate of adaptive MOS transistor 401. For example, the breakdown voltage of first zener diode 405 can be no larger than about the rated gate-source voltage of adaptive MOS transistor 401 to maintain the gate-source voltage thereof operating in a safe region.

One example operation process of this example cascode circuit using MOS transistors can be described as follows. The gate of main MOS transistor 402 can be used to receive a control signal. When main MOS transistor 402 is conducting, the drain voltage of main MOS transistor 402 may be pulled down as well as the source voltage of adaptive MOS transistor 401. Then, the gate-source voltage of adaptive MOS transistor 401 may be increased to turn on adaptive MOS transistor 401. After adaptive MOS transistor 401 is conducting, its drain voltage may be pulled down, and its gate voltage may also be pulled down. Diode 404 can be used to clamp the gate voltage of adaptive MOS transistor 401 to ($V_{cc}-V_{diode}$), where $V_{diode}$ can be the forward voltage drop of first diode 404. With the clamping of diode 404, the gate voltage of adaptive MOS transistor 401 may not be substantially reduced in order to avoid mis-shutdown of adaptive MOS transistor 401.

When main MOS transistor 402 is turned off, the drain voltage of adaptive MOS transistor 401 may be pulled up, and the gate voltage may also be pulled up. If the equivalent capacitance between the gate and the ground of adaptive MOS transistor 401 is relatively large while the Miller capacitance $C_{dg}$ of adaptive MOS transistor 401 is relatively small, the gate voltage may rise slowly while the drain voltage may rise rapidly. When the drain-gate voltage reaches a predetermined value, zener diode 403-1 may be broken down to clamp the drain-gate voltage of adaptive MOS transistor 401 to be no larger than the rated gate-drain voltage.

However, if the equivalent capacitance between the gate and the ground of adaptive MOS transistor 401 is relatively small, and the Miller capacitance $C_{dg}$ of adaptive MOS transistor 401 is relatively large, the gate voltage may rise rapidly to break zener diode 403-2 to clamp the gate voltage of adaptive MOS transistor 401. Since the gate-source voltage is relatively small, clamping the gate voltage can also mean clamping the drain-gate voltage to ensure that the drain-gate voltage of main MOS transistor 402 becomes no larger than the rated drain-gate voltage.

Also, when both of adaptive MOS transistor 401 and main MOS transistor 402 are conducting, zener diode 405 can used to ensure the gate-source voltage of adaptive MOS transistor 401 is always less than the forward voltage drop of zener diode 405. When the gate voltage rises to a predetermined value, zener diode 405 may be broken down to ensure the gate-source voltage of adaptive MOS transistor 401 to be less than the breakdown voltage of zener diode 405.

The following can give several examples of how to choose specific components in practical conditions. For example, if the cascode circuit as shown in FIG. 4 is applied to obtain an equivalent MOS transistor with about a 50V maximum withstand voltage, the rated drain-gate voltage of adaptive MOS transistor 401 can be about 35V, and the rated drain-gate voltage of main MOS transistor 402 can be about 25V. Thus, the breakdown voltages of zener diodes 403-1 and 403-2 can be about 30V and about 20V, respectively.

When main MOS transistor 402 is turned off, if the drain-gate voltage of adaptive MOS transistor 401 reaches about 30V, zener diode 403-1 may be broken down, and the drain-gate voltage of adaptive MOS transistor 401 can be clamped. Also, if the gate voltage of adaptive MOS transistor 401 reaches about 20V, zener diode 403-2 may be broken down, and the gate voltage of adaptive MOS transistor 401 can be clamped. In this way, main MOS transistor 401 may operate within a safe region.

Forward voltage drop $V_{diode}$ of diode 404 may be about 0.6V, the voltage source at the anode of first diode 404 can be the value of rated gate-source voltage $V_{cc}$ of main MOS transistor 402 (e.g., $V_{cc}$=3V). When main MOS transistor 402 is conducting, the gate voltage of adaptive MOS transistor 401 can be clamped to the difference value between rated gate-source voltage $V_{cc}$ and forward voltage drop $V_{diode}$ (e.g., Vcc−Vdiode=2.4V) by diode 404, then the gate voltage of adaptive MOS transistor 401 can be maintained to be no larger than the conduction threshold voltage of MOS transistor 401.

Zener diode 405 with about a 0.6V forward voltage drop can be used to ensure the gate-source voltage of MOS transistor 401 is maintained to be no larger than about 0.6V. The breakdown voltage of zener diode 405 can be substantially equal to the rated gate-source voltage (e.g., 3V) of adaptive MOS transistor 401. Zener diode 405 may be broken down when the gate voltage of adaptive MOS transistor 401 is rising, and then the gate-source voltage of MOS transistor 401 can be maintained as no larger than about 3V.

Figure 5:
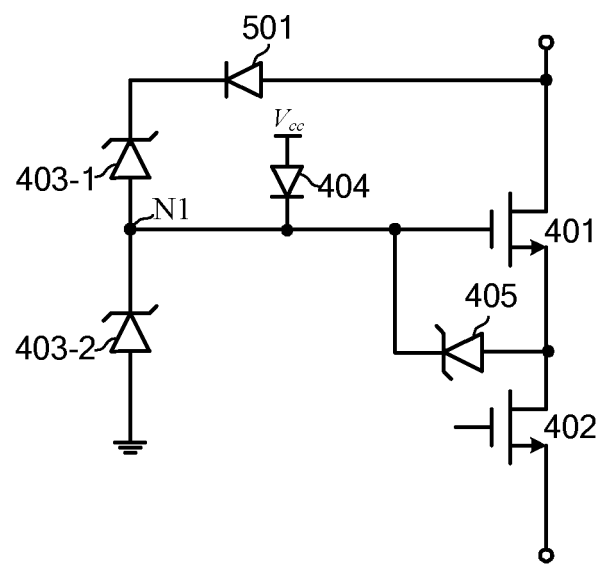
FIG. 5 is a schematic diagram of a third example adaptive cascode circuit using MOS transistors in accordance with embodiments of the present invention.

Referring to FIG. 5, shown is a schematic diagram of a third example adaptive cascode circuit using MOS transistors in accordance with embodiments of the present invention. The example here may add in a diode 501 based on the example as shown in FIG. 4, where the anode of diode 501 can be connected to the second terminal of the cascode circuit, and the cathode of diode 501 can be connected to the first terminal of the shutdown clamping circuit. This arrangement may avoid the drain voltage of adaptive MOS transistor 401 decreasing when main MOS transistor 402 is conducting. In addition, this arrangement may avoid potential power losses caused by current flowing through diode 404 and diode 403-1 to the drain of adaptive MOS transistor 401.

Figure 6:
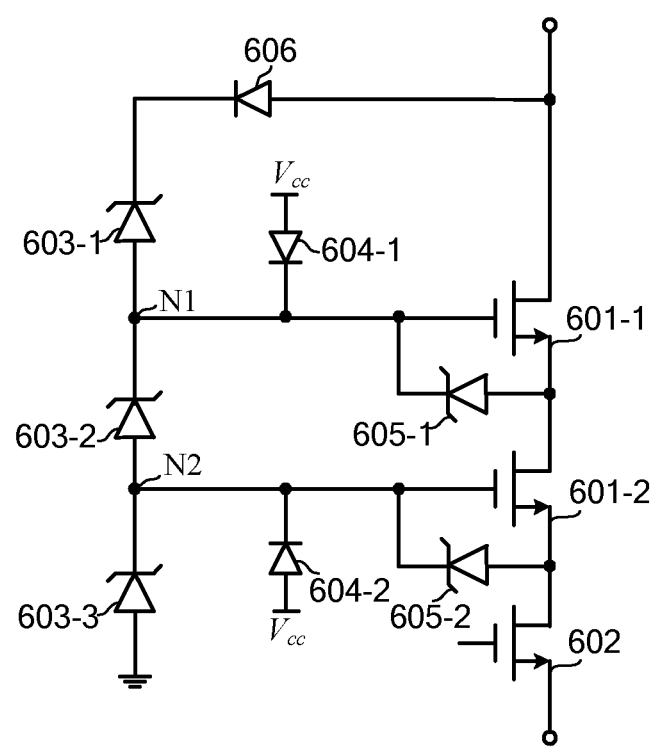
FIG. 6 is a schematic diagram of a fourth example adaptive cascode circuit using MOS transistors in accordance with embodiments of the present invention.

Referring to FIG. 6, shown is a schematic diagram of a fourth example adaptive cascode circuit using MOS transistors in accordance with embodiments of the present invention. In this example, the cascode circuit can include two adaptive MOS transistors 601-1 and 601-2, and main MOS transistor 602. This example cascode circuit can also include a shutdown clamping circuit formed by three series-connected zener diodes 603-1, 603-2, and 603-3. The cathode of diode 603-1 can be configured as the first terminal of the shutdown clamping circuit. Common nodes N1 and N2 of zener diodes 603-1, 603-2 and 603-3 can be connected to the gates of adaptive MOS transistors 601-1 and 601-2 as shown. The anode of zener diode 603-3 can be configured as the second terminal of the shutdown clamping circuit to connect to ground.

This example cascode circuit of FIG. 6 can also include diode 606 connected with the cathode of diode 603-1. The cascode circuit can also include conduction clamping circuits formed by diodes 604-1 and 604-2, and gate-source clamping circuits formed by zener diodes 605-1 and 605-2. From the example shown in FIG. 6, people skilled in the art will recognize that the adaptive cascode circuit using MOS transistors in accordance with the present invention can be applied to applications in which two or more MOS transistors are connected in series, as well as in different applications, where different MOS transistors can be chosen to form an equivalent MOS transistor with certain withstand parameters. In many practical production processes, the number of series-connected MOS transistors may not be limited so long as the maximum withstand voltage of the equivalent MOS transistor is no larger than the maximum voltage between the drain and the substrate.

Figure 7:
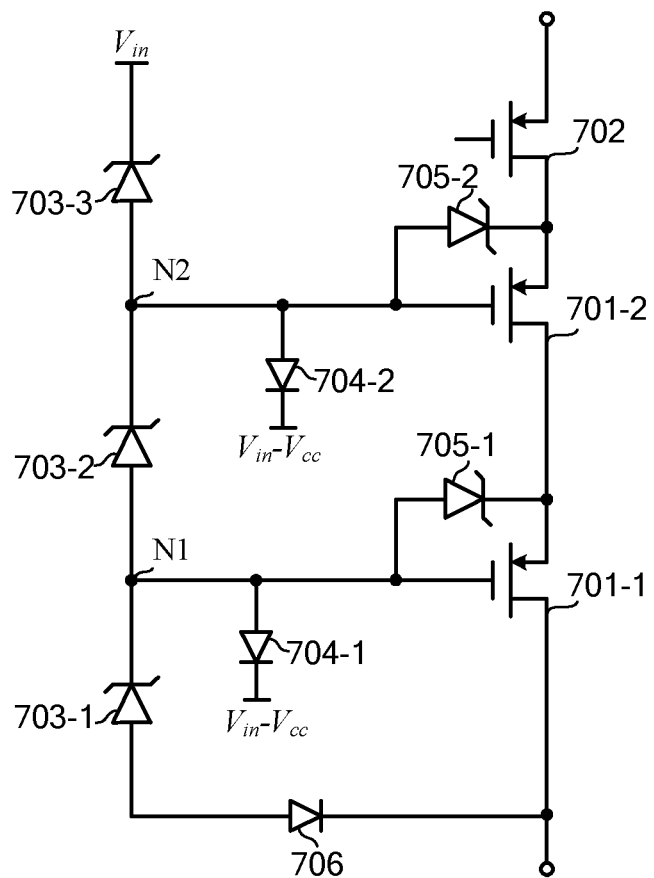
FIG. 7 is a schematic diagram of a fifth example adaptive cascode circuit using MOS transistors in accordance with embodiments of the present invention.

Referring to FIG. 7, shown is a schematic diagram of a fifth example adaptive cascode circuit using MOS transistors in accordance with embodiments of the present invention. Different from the above described examples, P-type MOS transistors can be taken as examples here. In this particular example, the cascode circuit can include series-connected adaptive MOS transistors 701-1, 701-2, where the drain of adaptive MOS transistor 701-1 can be configured as the second terminal of the adaptive cascode circuit. This example adaptive cascode circuit can also include main MOS transistor 702, where the source and the gate thereof can be configured as the first and control terminals, respectively, of the adaptive cascode circuit.

This example adaptive cascode circuit can also include a shutdown clamping circuit formed by series-connected zener diodes 703-1, 703-2 and 703-3. The anode of zener diode 703-1 can be configured as the second terminal of the shutdown clamping circuit. The common nodes N1 and N2 of zener diodes 703-1, 703-2 and 703-3 can be respectively connected to the gates of adaptive MOS transistors 701-1 and 701-2. The cathode of zener diode 703-3 can be configured as the first terminal of shutdown clamping circuit to connect with a highest voltage (e.g., a circuit supply voltage or input voltage $V_{in}$). For example, the breakdown voltages of zener diodes 703-1, 703-2, 703-3 may be no larger than the rated gate-drain voltages of adaptive MOS transistors 701-1, 701-2 and main MOS transistor 702.

This example adaptive cascode circuit of FIG. 7 can also include diode 706 connected to the anode of zener diode 703-1, and a gate-source clamping circuit formed by zener diodes 705-1 and 705-2. The anodes of zener diodes 705-1 and 705-2 can respectively connect to the gates of adaptive MOS transistors 701-1 and 701-2, while the cathodes thereof can be connected to the sources of adaptive MOS transistors 701-1 and 701-2. For example, the breakdown voltages of zener diodes 705-1 and 705-2 can be no larger than the rated gate-source voltages of adaptive MOS transistors 701-1 and 701-2.

This example adaptive cascode circuit of FIG. 7 can also include a conduction clamping circuit formed by diodes 704-1 and 704-2. The anodes of diodes 704-1 and 704-2 can be connected to the gates of corresponding adaptive MOS transistors 701-1 and 701-2, while the cathodes thereof can be connected to a predetermined voltage source to clamp the gate voltages of adaptive MOS transistors 701-1 and 701-2 to ensure that the conduction clamping voltage may be no less than the conduction threshold voltage of adaptive MOS transistor. In this example, the voltage source at the cathodes of diodes 704-1 and 704-2 can be the difference voltage ($V_{in}-V_{cc}$) between the highest voltage $V_{in}$ connected at the first terminal of the adaptive cascode circuit and the rated gate-source voltage $V_{cc}$ of main MOS transistor 702.

One example operation process of this example cascode circuit of FIG. 7 can be described as follows. The gate of main MOS transistor 702 may receive a control signal. When main MOS transistor 702 is conducting, its drain voltage may be pulled up to increase the voltage difference between the source and the gate of adaptive MOS transistor 701-2. Then, adaptive MOS transistor 701-2 may be conducting, and adaptive MOS transistor 701-1 may also subsequently be in conduction. As adaptive MOS transistors 701-1 and 701-2 are all conducting, their gate voltages may be pulled up as well as drain voltages, diodes 704-1 and 704-2 can be used to clamp the gate voltages of adaptive MOS transistors 701-1 and 701-2 to ($V_{in}-V_{cc}+V_{diode}$), where $V_{diode}$ can denote the forward voltage drops of diodes 704-1 and 704-2. With the clamping function of diodes 704-1 and 704-2, the gate voltages of adaptive MOS transistor 701-1 and 701-2 may not substantially increase in order to prevent mis-shutdown.

When main MOS transistor 702 is shutdown, the drain voltages of adaptive MOS transistor 701-1 may be pulled down, along with the gate voltage. If the equivalent capacitance between the gate of adaptive MOS transistor 701-1 and highest voltage is relatively large, while the Miller capacitance $C_{dg}$ between the gate and the drain is relatively small, the gate voltage may decrease slowly. When the gate-drain voltage reaches to a certain value, zener diode 703-1 may be broken down to clamp the gate-drain voltage of adaptive MOS transistor 701-1.

Also, if the equivalent capacitance between the gate of adaptive MOS transistor 701-1 and highest voltage is relatively small, while the Miller capacitance $C_{dg}$ between the gate and the drain is relatively large, the gate voltage may decrease quickly. Then, the voltage difference between the gate voltages of adaptive MOS transistor 701-1 and 701-2 may be large enough to break down zener diode 703-2. The gate voltages between adaptive MOS transistors 701-1 and 701-2 may be clamped, since the gate-drain voltage of adaptive MOS transistor 701-1 is relatively small, and the drain-gate voltage of adaptive MOS transistor 701-2 can also be clamped.

When the gate voltage of adaptive MOS transistor 701-2 is reduced to a predetermined value, zener diode 703-3 may be broken down to clamp the gate voltage of adaptive MOS transistor 701-2. Since the gate-source voltage of adaptive MOS transistor 701-2 may be very small, the drain-gate voltage of main MOS transistor 702 may be clamped. Therefore, with the clamping function of zener diodes 703-1, 703-2 and 703-3, the gate-drain voltages of adaptive MOS transistor 701-1, 701-2 and main MOS transistor 702 can be ensured to be no larger than the rated gate-drain voltages thereof.

Also, when adaptive MOS transistors 701-1, 701-2 and main MOS transistor 702 are all conducting, zener diodes 705-1 and 705-2 can ensure the gate-source voltages of adaptive MOS transistors 701-1 and 701-2 to be smaller than the forward voltage drops of zener diodes 705-1 and 705-2. When the gate voltage reduces to a predetermined value, zener diodes 705-1 and 705-2 may be broken down to ensure that the source-gate voltages of adaptive MOS transistors 701-1 and 701-2 are smaller than the breakdown voltages of zener diodes 705-1 and 705-2. Thus, zener diodes 705-1 and 705-2 can be utilized to keep the source-gate voltages of adaptive MOS transistors 701-1 and 701-2 operating in a safe region.

Diode 706 can be applied to avoid potential power losses due to current flowing from the drain of adaptive MOS transistor 701-1 through zener diode 703-1 and diode 704-1 to the voltage source connected with diode 704-1. Also, the cascode circuit in this example can be applied to other cascode circuits with two or more P-type MOS transistors by building up similar circuits as shown in FIG. 7.

In practical applications, because the circuit volume of adaptive MOS transistors may be relatively large, the gate-drain capacitances and the gate-source capacitances can be relatively large, the protection for MOS transistors by breaking down the zener diodes may be relatively weak, and failure to protect the adaptive MOS transistors timely. Hence, the above-described examples may not be particularly suitable for relatively fast-switching applications.

Figure 8:
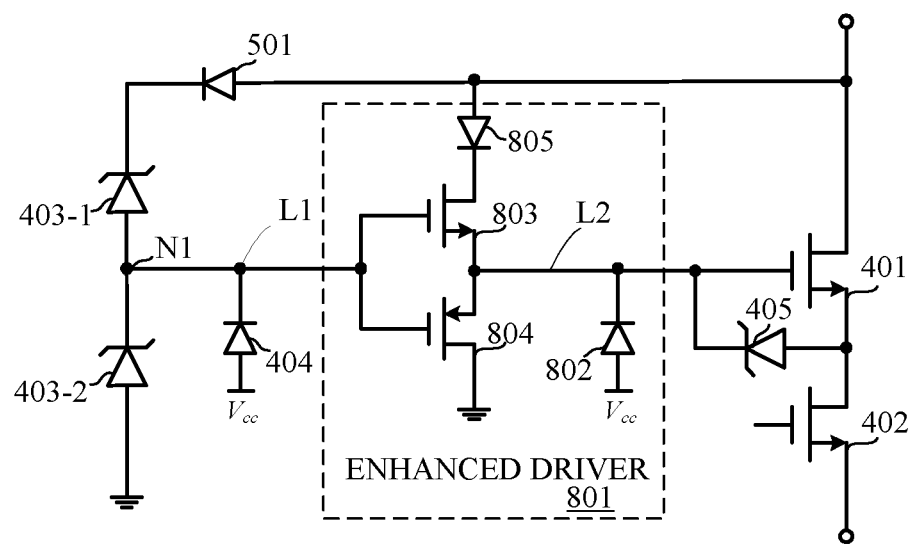
FIG. 8 is a schematic diagram of a sixth example adaptive cascode circuit using MOS transistors in accordance with embodiments of the present invention.

Referring to FIG. 8, shown is a schematic diagram of a sixth example adaptive cascode circuit with MOS transistors in accordance with embodiments of the present invention. In this example, enhanced driver 801 can be supplemented based on the example shown in FIG. 5 to accelerate the switching of adaptive MOS transistor 401. Enhanced driver 801 can include a push-pull circuit and diode 802.

The push-pull circuit can include N-type MOS transistor 803, P-type MOS transistor 804, and diode 805. N-type MOS transistor 803 can be connected in series with P-type MOS transistor 804 to the ground. The common node at the sources of N-type MOS transistor 803 and P-type MOS transistor 804 can be configured as the output terminal of the push-pull circuit to connect with the gate of adaptive MOS transistor 401. The common node at the gates of N-type MOS transistor 803 and P-type MOS transistor 804 can be configured as the input terminal of the push-pull circuit to connect with the cathode of diode 404. The cathode of diode 805 can be connected to the drain of N-type MOS transistor 803, while the anode thereof can be connected to the second terminal of the adaptive cascode circuit.

The anode of diode 802 can be connected to a voltage source having substantially the same value as the rated gate-source voltage $V_{cc}$ of main MOS transistor 402, while the cathode thereof can be connected to the gate of adaptive MOS transistor 401. The push-pull circuit can enhance the driving capacity to accelerate the switching of adaptive MOS transistor 401. The voltage at node L1 can be clamped to ($V_{cc}$-$V_{diode}$) when adaptive MOS transistor 401 is conducting, and voltage at node L2 can be ($V_{cc}$-$V_{diode}$-$V_{gs-803}$) because of the push-pull circuit, where $V_{gs-803}$ can denote the gate-source voltage of N-type MOS transistor 803. Thus, diode 802 can be applied to clamp the gate voltage of adaptive MOS transistor 401 once again to prevent mis-shutdown caused by the decreasing voltage at node L2. Diode 805 can be applied to avoid potential power losses due to current flowing from the voltage source connected with diode 802 through diode 802, the source-drain parasitic diode of N-type MOS transistor 803 to the drain of adaptive MOS transistor 401.

Figure 9:
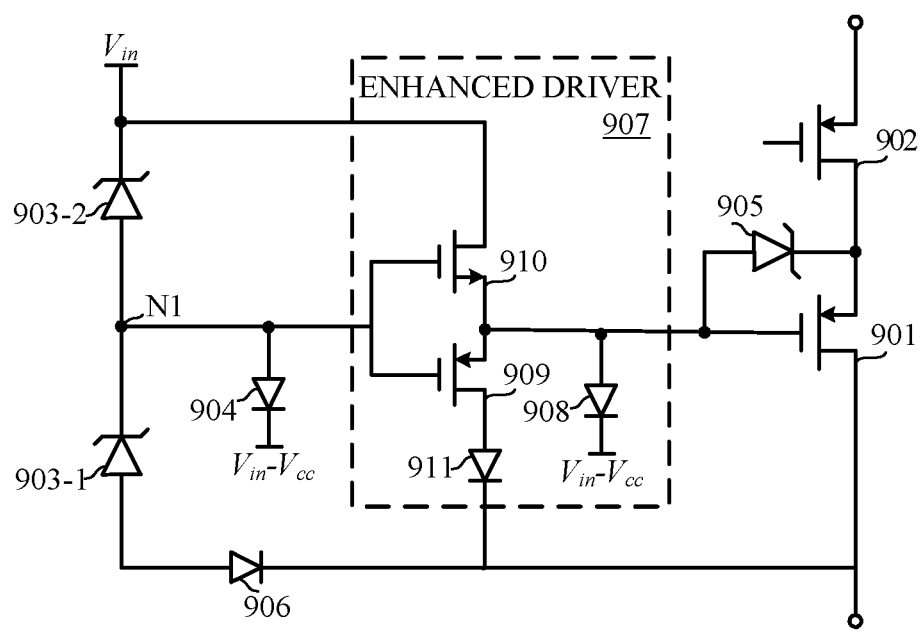
FIG. 9 is a schematic diagram of a seventh example adaptive cascode circuit using MOS transistors in accordance with embodiments of the present invention.

Referring to FIG. 9, shown is a schematic diagram of a seventh example adaptive cascode circuit for MOS transistors in accordance with embodiments of the present invention. The cascode MOS transistors can be P-type MOS transistors, enhanced driver 907 can be formed by a push-pull circuit and diode 908 to accelerate the switching of adaptive MOS transistor 901.

The push-pull circuit can include P-type MOS transistor 909, N-type MOS transistor 910 and diode 911. The drain of N-type MOS transistor 910 can be connected to the highest voltage (e.g., $V_{in}$) at the first terminal of the shutdown clamping circuit. P-type MOS transistor 909 and N-type MOS transistor 910 can be connected in series. The common node of the sources of P-type MOS transistor 909 and N-type MOS transistor 910 can be configured as the output terminal of the push-pull circuit to connect with the gate of adaptive MOS transistor 901. The common nodes at the gates of P-type MOS transistor 909 and N-type MOS transistor 910 can be configured as the input terminal of the push-pull circuit to connect with the anode of diode 904. The anode of diode 911 can be connected to the drain of P-type MOS transistor 909, while the cathode can be connected to the second terminal of adaptive cascode circuit.

The cathode of diode 908 can be connected to a voltage source with value of ($V_{in}$-$V_{cc}$), while the anode thereof can be connected to the gate of adaptive MOS transistor 901. Diode 911 can be applied to avoid the power losses due to the current flowing from the drain of adaptive MOS transistor 901 through the source-drain parasitic diode of P-type MOS transistor 909 and diode 908 to the voltage source connected at the cathode of diode 908.

FIGS. 8 and 9 show example cascode circuits with two N-type MOS transistors and two P-type MOS transistors, respectively. According to the teaching of the present invention, a plurality of similar enhanced drivers as described above can also be connected in series to accelerate the switching of P-type/N-type MOS transistors, in accordance with embodiments of the present invention.

Figure 10:
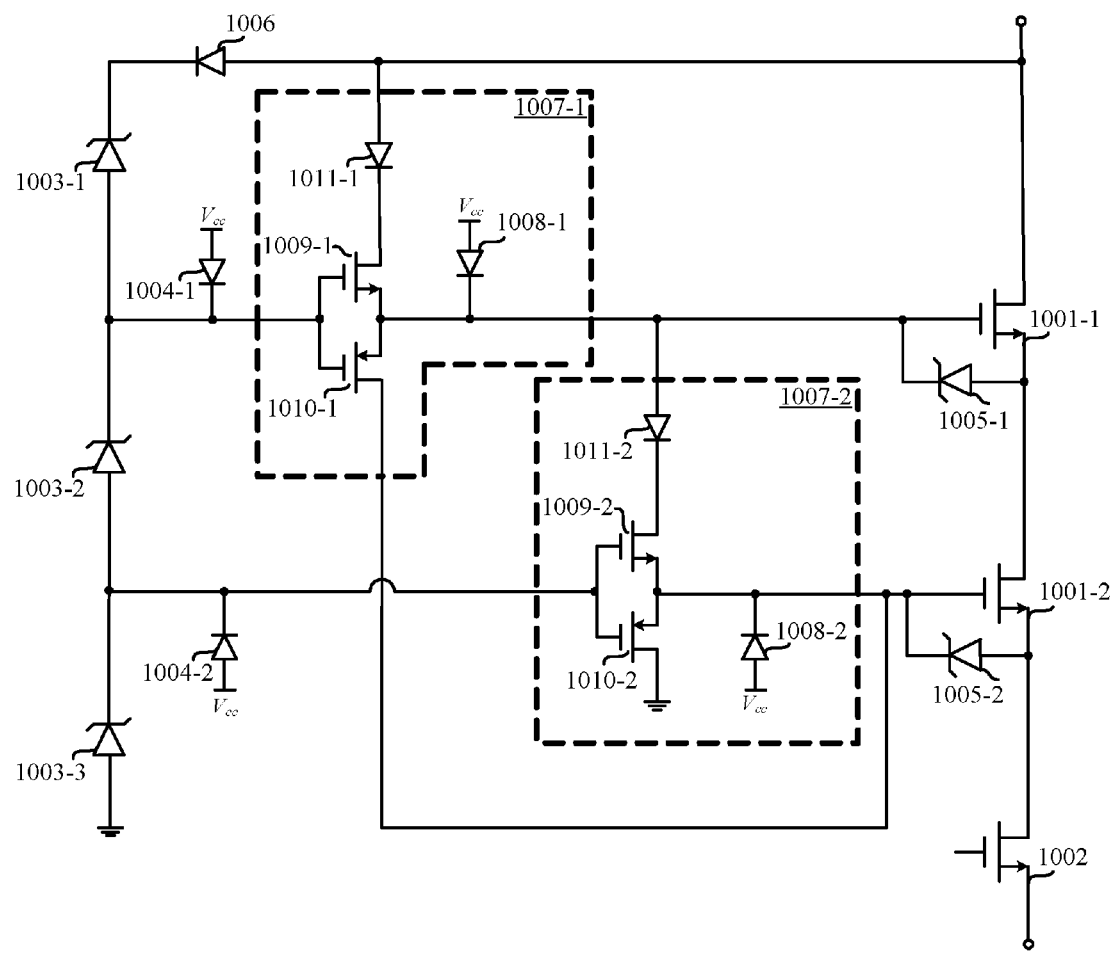
FIG. 10 is a schematic diagram of an eighth example adaptive cascode circuit using MOS transistors in accordance with embodiments of the present invention.

Referring to FIG. 10, shown is a schematic diagram of an eighth example adaptive cascode circuit for MOS transistors in accordance with embodiments of the present invention. In this example, enhanced drivers 1007-1 and 1007-2, similar to those discussed above with reference to FIG. 8, can be supplemented to the circuit of FIG. 6.

In the particular example of FIG. 10, the anode of diode 1011-1 can be connected to the second terminal of the cascode circuit. The common nodes of the gates of N-type MOS transistor 1009-1 and P-type MOS transistor 1010-1 can be configured as the input terminal of enhanced driver 1007-1 to connect with the cathode of diode 1004-1. The drain of P-type MOS transistor 1010-1 can connect to the gate of adaptive MOS transistor 1101-2. Also, the cathode of diode 1008-1 can be configured as the output terminal of enhanced driver 1007-1 to connect to the gate of adaptive MOS transistor 1001-1.

Similarly, the anode of diode 1011-2 can be connected to the gate of adaptive MOS transistor 1001-1. Also, the common nodes of the gates of N-type MOS transistor 1009-2 and P-type MOS transistor 1010-2 can be configured as the input terminal of enhanced driver 1007-2 to connect with the cathode of diode 1004-2. The drain of P-type MOS transistor

1010-2 can connect to ground, and the cathode of diode 1008-2 can connect to the gate of adaptive MOS transistor 1001-2.

The function of enhanced drivers 1007-1 and 1007-2 and the connection of remaining parts of the cascode circuit can be as discussed above. In addition, when the number of cascode MOS transistors is three or more than three, a similar circuit can be obtained according to the principle of the example cascode circuit as shown in FIG. 10.

Figure 11:
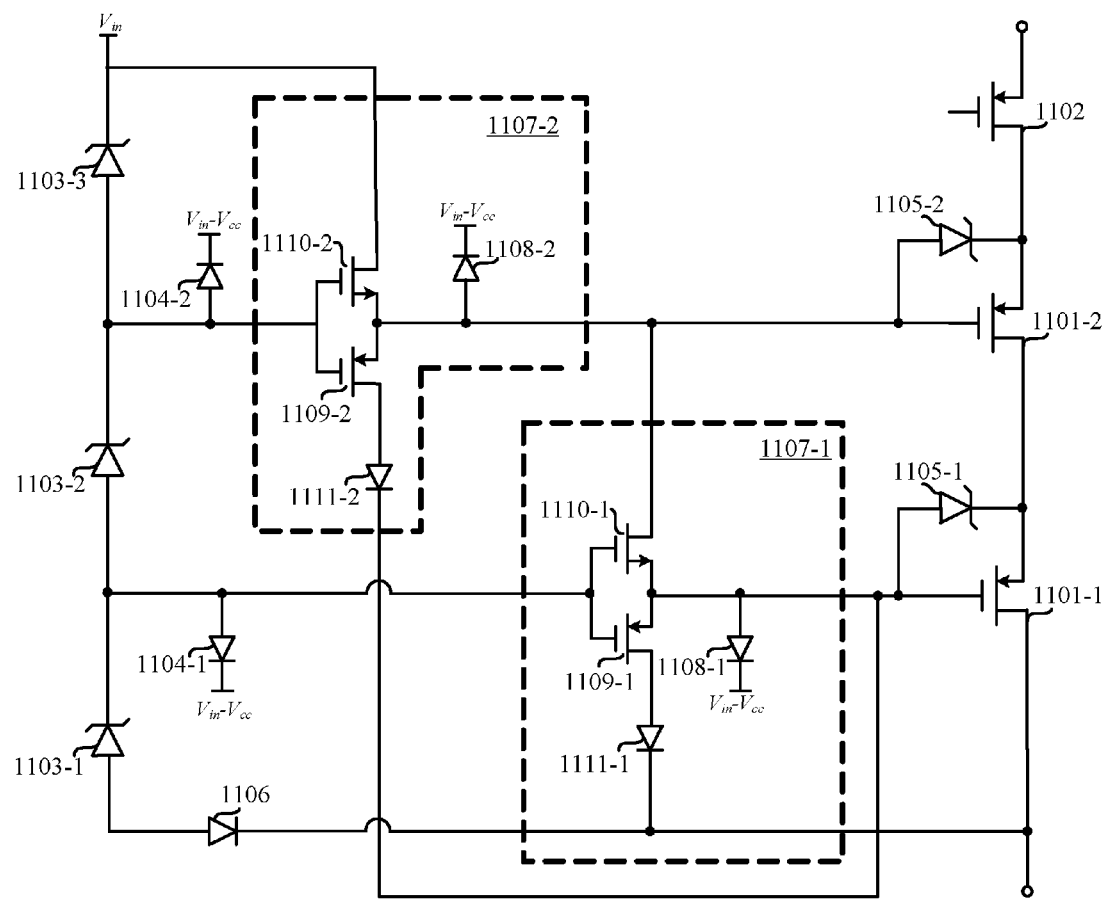
FIG. 11 is a schematic diagram of a ninth example adaptive cascode circuit using MOS transistors in accordance with embodiments of the present invention.

Referring to FIG. 11, shown is a schematic diagram of a ninth example adaptive cascode circuit for MOS transistors in accordance with embodiments of the present invention. In this example, enhanced drivers 1107-1 and 1107-2 can be supplemented to the circuit as shown in FIG. 7 discussed above. Enhanced driver 1107-1 can be used to accelerate the switching of adaptive MOS transistor 1101-1, and enhanced driver 1107-2 can be used to accelerate the switching of adaptive MOS transistor 1101-2.

The drain of N-type MOS transistor 1110-2 can be connected to a highest voltage (e.g., $V_{in}$). Also, the common nodes of the gates of N-type MOS transistor 1110-2 and P-type MOS transistor 1109-2 can be configured as the input terminal of enhanced driver 1107-2 to connect with the anode of diode 1104-2. The cathode of diode 1111-2 can connect to the gate of adaptive MOS transistor 1101-1. Also, the anode of diode 1108-2 can be configured as the output terminal of enhanced driver 1107-2 to connect with the gate of adaptive MOS transistor 1101-2.

Similarly, the drain of N-type MOS transistor 1110-1 can be connected to the gate of adaptive MOS transistor 1001-2. The common nodes of the gates of N-type MOS transistor 1110-1 and P-type MOS transistor 1109-1 can be configured as the input terminal of enhanced driver 1107-1 to connect with the anode of diode 1104-1. The cathode of diode 1111-1 can be connected to the second terminal of the cascode circuit, and the anode of diode 1108-1 can be configured as the output terminal of enhanced driver 1107-1 to connect with the gate of adaptive MOS transistor 1101-1.

The function of enhanced drivers 1107-1 and 1107-2 and the connection of remaining parts of the cascode circuit in this example can be derived from the above-described example as shown in FIG. 9. Also, when the number of cascode MOS transistors is three or more than three, a similar circuit can be obtained according to the principle of the example cascode circuit as shown in FIG. 11.

Figure 12:
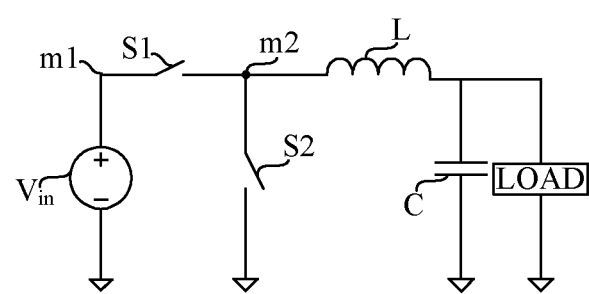
FIG. 12 is a schematic diagram of an example application circuit of the cascode circuit using MOS transistors in accordance with embodiments of the present invention.

Referring to FIG. 12, shown is an example application circuit of the cascode circuit using MOS transistors in accordance with the embodiments of the present invention. The main circuit can be of a buck topology. In order to keep switches S1 and S2 working safely under high voltages, a cascode circuit using a plurality of P-type MOS transistors can be configured to form switch S1. As shown in FIG. 12, node m1 can be the first terminal of the cascode circuit using P-type MOS transistors and node m2 can be the second terminal of the cascode circuit. In addition, a control signal for switch S1 can be received at the control terminal of the cascode circuit using P-type MOS transistors.

Similarly, a cascode circuit using a plurality of N-type MOS transistors can be configured to form switch S2. The first terminal of the cascode circuit using N-type MOS transistors can be connected to node m2, and the second terminal of the cascode circuit using N-type MOS transistors can be connected to the ground. In addition, a control signal for switch S2 can be received at the control terminal of the cascode circuit using N-type MOS transistors.

In FIG. 12, buck topology may be taken as the main circuit to facilitate the explanation of the application of the cascode circuit using MOS transistors in accordance with embodiments of the present invention. However, the main circuit may not be limited to buck topology, but can also be a switching regulator, a light emitting diode (LED) driver, a high-voltage boost regulator, a linear regulator, or any other appropriate topologies. The number, type and parameter of MOS transistors can be chosen to form the equivalent MOS transistor to meet high-voltage requirements for different applications.

The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. An adaptive cascode circuit, comprising:
    a) a main MOS transistor, wherein a source of said main MOS transistor is configured as a first terminal of said adaptive cascode circuit, and wherein a gate of said main MOS transistor is configured as a control terminal of said adaptive cascode circuit;
    b) n adaptive MOS transistors coupled in series to a drain of said main MOS transistor, wherein a drain of a first adaptive MOS transistor is configured as a second terminal of said adaptive cascode circuit, and wherein n is an integer greater than one;
    c) a shutdown clamping circuit coupled to gates of said n adaptive MOS transistors, wherein said shutdown clamping circuit comprises (n+1) shutdown clamping voltages that are less than corresponding rated drain-gate voltages of said main MOS transistor and said n adaptive MOS transistors, wherein said shutdown clamping circuit is configured to clamp drain-gate voltages of said main MOS transistor and said n adaptive MOS transistors to corresponding said shutdown clamping voltages when said main MOS transistor and said n adaptive MOS transistors are shutdown; and
    d) n conduction clamping circuits coupled to gates of corresponding said n adaptive MOS transistors, wherein said n conduction clamping circuits comprise n conduction clamping voltages greater than corresponding conduction threshold voltages of said adaptive MOS transistors, wherein said n conduction clamping circuits are configured to clamp said gate voltages of said n adaptive MOS transistors to corresponding said n conduction clamping voltages when said n adaptive MOS transistors and said main MOS transistor are conducting.

2. The adaptive cascode circuit of claim 1, further comprising:
    a) n gate-source clamping circuits coupled between gates and sources of corresponding said n adaptive MOS transistors, wherein said n gate-source clamping circuits comprise n gate-source clamping voltages no larger than rated gate-source voltages of said n adaptive MOS transistors; and
    b) wherein when said n adaptive MOS transistors and said main MOS transistor are conducting, said gate-source clamping circuits are configured to clamp gate-source voltages of said n adaptive MOS transistors to corresponding said n gate-source clamping voltages.

3. The adaptive cascode circuit of claim 2, wherein:
    a) said n adaptive MOS transistors and main MOS transistor comprise N-type MOS transistors, and each of said n gate-source clamping circuits comprises a first zener diode; and b) an anode of said first zener diode is coupled to a source of a corresponding said adaptive MOS transistor, and a cathode of said first zener diode is coupled to a gate of a corresponding said adaptive MOS transistor.

4. The adaptive cascode circuit of claim 2, wherein:
a) said n adaptive MOS transistors and said main MOS transistor comprise P-type MOS transistors, each of said n gate-source clamping circuits comprises a second zener diode; and
b) an anode of said second zener diode is coupled to a gate of a corresponding said adaptive MOS transistor, and a cathode of said second zener diode is coupled to a source of a corresponding said adaptive MOS transistor.

5. The adaptive cascode circuit of claim 1, wherein:
a) said n adaptive MOS transistors and said main MOS transistor comprise N-type MOS transistors, a first terminal of said shutdown clamping circuit is coupled to a second terminal of said adaptive cascode circuit, and a second terminal of said shutdown clamping circuit is coupled to ground; and
b) each of said n conduction clamping circuits comprises a first diode, wherein a cathode of said first diode is coupled to a gate of a corresponding said adaptive MOS transistor, and an anode of said first diode is coupled to a voltage source.

6. The adaptive cascode circuit of claim 5, wherein:
a) said shutdown clamping circuit comprises series coupled (n+1) third zener diodes, wherein n common nodes of said (n+1) third zener diodes are respectively coupled to gates of said n adaptive MOS transistors;
b) a cathode of a first of said third zener diodes is configured as a first terminal of said shutdown clamping circuit to couple with a second terminal of said adaptive cascode circuit; and
c) an anode of said $n^{th}$ of said third zener diodes is configured as a second terminal of said shutdown clamping circuit to couple with ground.

7. The adaptive cascode circuit of claim 6, further comprising a third diode, wherein an anode of said third diode is coupled to a second terminal of said adaptive cascode circuit, and wherein a cathode of said third diode is coupled to a first terminal of said shutdown clamping circuit.

8. The adaptive cascode circuit of claim 1, wherein:
a) said n adaptive MOS transistors and said main MOS transistor comprise P-type MOS transistors, a first terminal of said shutdown clamping circuit is coupled to a highest voltage, and a second terminal of said shutdown clamping circuit is coupled to a second terminal of said adaptive cascode circuit; and
b) each of said n conduction clamping circuits comprises a second diode, wherein an anode of said second diode is coupled to a gate of a corresponding said adaptive MOS transistor, and a cathode of said second diode is coupled to a voltage source with a value of a difference voltage between said highest voltage and a rated gate-source voltage of said main MOS transistor.

9. The adaptive cascode circuit of claim 8, wherein:
a) said shutdown clamping circuit comprises series coupled (n+1) fourth zener diodes, wherein n common nodes of said (n+1) fourth zener diodes are respectively coupled to gates of said n adaptive MOS transistors;
b) an anode of a first of said fourth zener diodes is configured as a second terminal of said shutdown clamping circuit to couple with a second terminal of said adaptive cascode circuit; and c) a cathode of the $(n+1)^{th}$ of said fourth zener diodes is configured as a first terminal of said shutdown clamping circuit to couple with the highest voltage.

10. The adaptive cascode circuit of claim 9, further comprising a fourth diode, wherein a cathode of said fourth diode is coupled to a second terminal of said adaptive cascode circuit, and an anode of said fourth diode is coupled to a second terminal of said shutdown clamping circuit.

11. The adaptive cascode circuit of claim 1, wherein:
a) said n adaptive MOS transistors and said main MOS transistor comprise N-type MOS transistors, said n adaptive MOS transistors are coupled to at least one of a plurality of enhanced drivers, wherein each of said enhanced drivers comprises a push-pull circuit and a fifth diode;
b) an input terminal of said push-pull circuit is coupled to a corresponding said conduction clamping circuit, and an output terminal of said push-pull circuit is coupled to a gate of a corresponding said adaptive MOS transistor; and
c) an anode of said fifth diode is coupled to a voltage source, and a cathode of said fifth diode is coupled to a gate of a corresponding said adaptive MOS transistor.

12. The adaptive cascode circuit of claim 1, wherein:
a) said n adaptive MOS transistors and said main MOS transistor comprise P-type MOS transistors, wherein said n adaptive MOS transistors are coupled to at least one of a plurality of enhanced drivers, and wherein each of said enhanced drivers comprises a push-pull circuit and a sixth diode;
b) an input terminal of said push-pull circuit is coupled to a corresponding said conduction clamping circuit, and an output terminal of said push-pull circuit is coupled to a gate of a corresponding said adaptive MOS transistor; and
c) a cathode of said sixth diode is coupled to a voltage source, and an anode of said sixth diode is coupled to a gate of said adaptive MOS transistor.

13. The adaptive cascode circuit of claim 1, wherein said n adaptive MOS transistors are configured to be turned on in sequence after said main MOS transistor is turned on.

14. The adaptive cascode circuit of claim 13, wherein said n conduction clamping circuits are configured to clamp said gate voltages of said n adaptive MOS transistors to corresponding said n conduction clamping voltages after all of said n adaptive MOS transistors are turned on.

15. A switching power supply, comprising:
a) an input supply coupled to a first switch at an input node;
b) a second switch coupled to said first switch at a common node, wherein each of said first and second switches comprises said adaptive cascode circuit of claim 1; and
c) an inductor coupled to said common node and an output node.

16. The switching power supply of claim 15, wherein:
a) said first switch comprises P-type MOS transistors as said adaptive and said main MOS transistors in said adaptive cascode circuit; and
b) said second switch comprises N-type MOS transistors as said adaptive and said main MOS transistors in said adaptive cascode circuit.

* * * * *